(12) United States Patent
McKee Cooper

(10) Patent No.: US 7,664,276 B2
(45) Date of Patent: Feb. 16, 2010

(54) MULTIPASS PARAMETRIC OR GRAPHIC EQ FITTING

(75) Inventor: Joel C. McKee Cooper, Lafayette, CO (US)

(73) Assignee: Cirrus Logic, Inc., Austin, TX (US)

( * ) Notice: Subject to any disclaimer, the term of this patent is extended or adjusted under 35 U.S.C. 154(b) by 1014 days.

(21) Appl. No.: 11/057,367

(22) Filed: Feb. 15, 2005

(65) Prior Publication Data
US 2006/0062405 A1    Mar. 23, 2006

Related U.S. Application Data

(63) Continuation-in-part of application No. 11/038,577, filed on Jan. 21, 2005, and a continuation-in-part of application No. 11/002,102, filed on Dec. 3, 2004.

(60) Provisional application No. 60/612,474, filed on Sep. 23, 2004.

(51) Int. Cl.
*H03G 5/00* (2006.01)
(52) U.S. Cl. .............................. 381/103; 333/28 R
(58) Field of Classification Search ............ 381/56, 381/58, 103; 333/28 R; 375/229–231
See application file for complete search history.

(56) References Cited

U.S. PATENT DOCUMENTS

| | | | | |
|---|---|---|---|---|
| 5,506,910 A | * | 4/1996 | Miller et al. | 381/103 |
| 5,572,443 A | * | 11/1996 | Emoto et al. | 702/103 |
| 5,768,398 A | * | 6/1998 | Janse et al. | 381/103 |
| 5,930,370 A | | 7/1999 | Ruzicka | 381/18 |
| 6,253,293 B1 | | 6/2001 | Rao et al. | 711/147 |
| 6,639,989 B1 | * | 10/2003 | Zacharov et al. | 381/103 |
| 6,655,212 B2 | | 12/2003 | Ohta | 73/586 |
| 6,721,428 B1 | | 4/2004 | Allred et al. | 381/103 |
| 7,529,377 B2 | * | 5/2009 | Nackvi et al. | 381/103 |
| 2004/0258259 A1 | | 12/2004 | Koyama | 381/307 |

OTHER PUBLICATIONS

SHARC Melody Platform with Auto Room Tuner (ART) Technology, Analog Devices, www.analog.com/SHARC, © 2004, Analog Devices, Inc. One Technology Way, P.O. Box 9106, Norwood, MA 02062-9106.

(Continued)

*Primary Examiner*—Xu Mei
(74) *Attorney, Agent, or Firm*—Robert Platt Bell; Steven Lin

(57) ABSTRACT

Multiple passes are executed in the setup of an equalizer, and modification of the equalization is performed after each pass of an analysis phase. After an initial pass, the equalization is adjusted, based upon the location of peaks and valleys in the system response. This initial adjustment of equalization may tend to flatten most of the peaks and valleys to produce the desired uniform linear response. Inexact application of equalization corrections may introduce other artifacts into the system response and/or may not sufficiently normalize equalization. A second pass is then performed to measure the system response using the new equalization settings. The new peaks and valleys are measured, and the equalization adjusted to try to flatten response further. A proximity range may be applied to each pass, to reduce the likelihood that adjustment of one equalizer coefficient will create artifacts in the resulting system response.

18 Claims, 5 Drawing Sheets

OTHER PUBLICATIONS

Transfer-Function Measurement with Maximum-Length Sequences, Douglas D. Rife and John Vanderkoov, J. Audio Eng. Soc., vol. 37, No. 6, Jun. 1989.

An Efficient Algorithm for Measuring the Impulse Response Using Pseudorandom Noise, Jeffrey Borish and James B. Angell, J. Audio Eng. Soc., vol. 37, No. 7, Jul./Aug. 1983.

"Cirrus Logic's Intelligent room Calibration Software Optimizes Audio receiver System, Speaker Response for Ideal Sound Experience", http://www.cirrus.com/en/press/releases/P426.html, Oct. 5, 2004.

Adaptive Signal Processing, Bernard Widrow, (c) 1985, Prentiss-Hall, INc., Englewood Cliffs, New Jersey, 17632. ISBN 0-13-004029 01.

* cited by examiner

MULTIPASS PARAMETRIC OR GRAPHIC EQ FITTING

CROSS-REFERENCE TO RELATED APPLICATIONS

The present application claims priority from Provisional U.S. Patent Application No. 60/612,474 filed on Sep. 23, 2004, and incorporated herein by reference. The present application is also a Continuation-In-Part of U.S. patent application Ser. No. 11/002,102 entitled "TECHNIQUE FOR SUBWOOFER DISTANCE MEASUREMENT", filed on Dec. 3, 2004, and incorporated herein by reference. The present application is also a Continuation-In-Part of U.S. patent application Ser. No. 11/038,577, filed on Jan. 21, 2005, and incorporated herein by reference.

FIELD OF THE INVENTION

The present invention relates to a method and apparatus for automatically equalizing a home theater or other audio system. In particular, the present invention is directed toward a technique for providing continuous or active adaptation of the equalization of a home theater or other audio system.

BACKGROUND OF THE INVENTION

Home theater systems, which once were expensive luxury items, are now becoming commonplace entertainment devices. Complete Home Theater systems, known as a Home Theater In a Box (HTIB), are available to consumers at reasonable prices. However, properly setting up such Home Theater systems can sometimes be problematic for the consumer.

Home theater systems provide a number of components, which may be located in various parts of the room. The components include the home theater receiver/amplifier, front stereo speakers (left and right), rear surround sound speakers (left and right), a center speaker, and a subwoofer. Various other combinations of speakers may also be used, including additional or fewer speakers. One such home theater system is described, for example, in U.S. Pat. No. 5,930,370, issued Jul. 27, 1999 to Ruzicka, incorporated herein by reference.

FIG. 1 depicts a diagrammatic view of the home theater surround sound speaker system (the surround sound system) 10 arranged in accordance with the principles of the present invention. The surround sound system 10 includes a source of a preferably amplified stereo signal, shown in FIG. 4 as television ("TV") set 12. The stereo audio source may be any of a number of audio signal sources. It should, thus, be noted that the source of a stereo audio signal is represented herein as television 12, but the audio signal source may also be a stereo receiver, a car stereo, a portable compact disk or tape player, a portable boom-box type stereo, or any other source of a stereo signal.

Television 12 outputs an amplified audio signal to interconnect module 14 via a multi-conductor cable 16. Multi-conductor cable 16 typically includes two conductor pairs for conducting the left and right channels of the stereo signal output by television 12 to interconnect module 14. Interconnect module 14 receives the audio signals from television 12 and assembles the component left and right channel signals for selective distribution to particular component speakers of the surround sound system 10.

The component speakers typically include a sub-woofer 18, which receives full range left and right signals, but only reproduces the low frequency components of the audio signal. Interconnect module 14 also outputs an audio signal to front center speaker 20. Front center speaker 20 receives both the left and right component signals of the stereophonic signal and reproduces the (L+R) summation signal. Preferably, front center speaker 20 is located in proximity to television 12 and projects the acoustic output of the (L+R) summation signal toward the listener 28.

Interconnect module 14 also outputs the left channel signal to left satellite speaker 22 and right channel signal to right satellite speaker 24. Left satellite speaker 22 and right satellite speaker 24 may be relatively small speakers and need only reproduce mid range and/or high frequency signals. Left and right satellite speakers are preferably oriented so that the primary axis of radiation of the speaker points upward along a vertical axis; however, other orientations of the satellite speakers may also provide satisfactory performance. Interconnect module 14 also outputs an audio signal to rear ambience speaker 26. Rear ambience speaker 26 typically receives an audio signal in the form of a left channel minus right channel (L−R) or a right channel minus left channel (R−L) difference signal. As will become apparent throughout this detailed description, several embodiments of the invention described herein enable interconnect module 14 to generate a variety of signals to be output to left satellite speaker 22, right satellite speaker 24, and/or rear ambience speaker 26. It should be noted at the outset that the term speaker refers to a system for converting electrical input signals to acoustic output signals where the system may include one or a number of crossover networks and/or transducers.

The components described in FIG. 1 typically are arranged to optimize the surround sound effect to enhance the listening experience of the viewer 28. The viewer 28 typically faces television 12 which has front center speaker 20 arranged in proximity to television 12 so that center speaker 20 and television 12 radiate their respective audio and video output in the general direction of viewer 28. The left satellite speaker 22 typically is arranged to the left side of viewer 28 while right satellite speaker 24 is arranged to the right side of viewer 28, both satellite speakers typically being located nominally midway between the viewer 28 and television 12. Rear ambience speaker 26, which contributes to creating a spacious audio effect, is typically located behind viewer 28. Rear ambience speaker 26 is depicted as a single speaker, but multiple rear speakers 26 may be included in the system.

One problem with these home theater systems is in adjusting the equalization of the system to compensate for room acoustics, speaker type, and other factors. Traditionally, a consumer adjusted equalization using a so-called graphic equalizer, where a number of narrow band-pass filters are provided, each with a corresponding slide switch. The consumer adjusts each slide switch to attenuate or amplify a particular frequency band. More modern systems may use electronic displays in place of the slide switches, but the overall functionality is the same.

The purpose of an equalizer is to provide an audio response that is generally "flat" across the entire frequency spectrum. Due to limitations in system and speaker design, as well as room acoustics and interaction of room acoustics with speaker design and placement, various frequency ranges in a system may be attenuated or accentuated, resulting in a sound reproduction which is not faithful to the original recording.

A "flat" response generally refers to the resulting frequency versus amplitude graph. If the system is properly equalized, the graph should look like a flat line though all frequency ranges. In reality, this goal is never entirely achieved due to limitations of audio components and room acoustics. However, with a graphic equalizer, it is possible to improve the response considerably such that the resulting sound is a more faithful reproduction of the original sound.

The problem with manually operated graphic equalizers is that the equalization is based upon the consumer setting the various frequency levels based upon what the consumer hears and what the consumer thinks will create the proper equalization for the system. This manual solution is a largely empirical approach, as many consumers cannot properly isolate various frequencies "by ear" and understand how to adjust the equalizer properly. In addition, as the music type and sound changes, as well as the acoustic properties of the room, the equalization set at one level may be inappropriate for another audio environment.

The early graphic equalizers generally had a fixed number of equalizer circuits, each adjusting a predetermined narrow band of frequencies. However, when attempting to equalize a system, it becomes readily apparent that certain frequency ranges may require finer incremental ranges of adjustment, whereas whole bands of frequencies can be adequately adjusted using a single circuit. Proving additional equalizer filter elements and switches to solve this problem is prohibitively expensive. The parametric equalizer helps solve this problem by allowing a limited number of equalizer elements to adjust audio levels in a flexible manner. Each level adjustment may be itself adjusted to control a different frequency range.

Thus, each band-pass filter in the equalizer may be adjusted for width. Frequency ranges that require a fine granularity of adjustment may be more precisely controlled using a number of narrow-band elements in the parametric equalizer. Large frequency ranges that can be adjusted as a group can be controlled with one single wide-band element in the parametric equalizer. In this manner, the parametric equalizer can provide a more sophisticated and correct equalization to the frequency spectrum with the same number or even fewer control elements than a typical prior art fixed-frequency element graphic equalizer. Again, however, if a consumer attempts to manually control equalization, the results are often less than optimal, as the results are based upon the ability of the consumer to discern different frequency ranges.

Equalization can be achieved in software as well as in hardware. For example, when decoding a digital data stream, such as from a CD, DVD, or other digital audio source, equalization may be applied to the data as part of the decoding process or in a separate step. Thus, the process of equalization, either using a fixed-bandwidth graphic equalizer or a variable-bandwidth parametric equalizer, can be achieved in software as well as in hardware, or in a combination of both.

Other systems are known in the art wherein home theater systems, particularly more low-end units, provide a limited number of pre-set equalization patterns for different music types and listening styles. Thus, a home theater system may provide pre-set equalization levels for rock music, jazz, classical, rap, or for movie or DVD playback or the like. The equalization takes place in software within the home theater system. These pre-set levels do not take into account the room acoustics and provide only limited choices to the consumer. The consumer can only select the equalization setup that sounds best for the given circumstances. The system is not optimized for the room acoustics, speakers, and other factors affecting audio playback.

More recently, one of the more popular features for home theater systems has been some form of automatic equalization setup to minimize adverse affects of speaker/room interactions. Most solutions, however, involve a one-time setup performed by the user when installing the system and/or prior to listening to music and/or watching a video or the like. An example of such a prior art equalization system is illustrated in U.S. Pat. No. 6,721,428, issued Apr. 13, 2004 to Allred et al. and incorporated herein by reference.

These prior art automatic equalization setup systems typically have three phases. First, the system is analyzed from a single position or multiple positions in the room, usually by generating an audio signal through the speakers, and then receiving the audio signal through a remote microphone or the like to produce a system response. Second, the results of such analysis are translated to a run-time equalization setup and saved. Run-time equalization refers to the process of equalizing the audio signal during the digital decoding stage. Third, the saved settings are used by the equalizer at run-time as an additional post-processing step to whatever other audio processor software is running at the time.

Examples of such other audio processor software include Dolby™ Digital™ AC-3, Digital Theater Systems (DTS), Pulse Code Modulation (PCM), bass management, delay control or the like. These various digital audio processing algorithms are known in the art and may be licensed from their respective producers, or comparable algorithms may be devised. The equalization algorithms of the Prior Art may thus be applied subsequent to the decoding step in the playback of a digital audio stream from a DVD, CD, or other audio source. Such audio processor software may include an existing equalization algorithm, which may receive an input based upon system response in the room.

The extent to which the system can be corrected for the speaker/room acoustics is largely determined by the complexity of the run-time equalization. For many low- to mid-level systems, the run-time equalization is simply the parametric or graphic equalizer already present in the software, and thus correction possibilities may be limited. Thus, it remains a difficulty in the prior art as to how to best fit a fixed-band graphic equalizer or parametric equalizer to a predetermined frequency response.

There are a number of prior solutions to the problem of fitting a fixed-band equalizer to a predetermined frequency response. One solution is a straightforward curve-fitting. For an n-band equalizer, the algorithm finds the n highest peaks and/or valleys in the frequency response and sets each band to correct the corresponding feature. Thus, if a particular frequency range is too high, it may be attenuated, and if a particular frequency range is too low, it may be boosted.

There are at least two problems with the curve-fitting technique. Quite often the peaks found in a system response (here, the term "system response" refers to the response of the speaker and room) are at least partially due to phase-response issues, which may not respond in the desired manner to a frequency-based solution. Applying a −3 dB equalization to a 3 dB peak may not flatten the response as intended.

The "phase response" of the speaker in the room is a function of frequency and is one part of the frequency response. The other part is the magnitude response (often inaccurately called the "frequency response"), which is the power level (Y-axis, usually in dB) plotted against frequency (X-axis in Hz).

A second problem with the curve fitting technique is the limited granularity of the underlying equalizer. For run-time equalizers with a limited range of center frequencies (either a graphic equalizer or a limited-implementation of a parametric equalizer), it may not be possible to exactly "center" on the peak or valley in system response. Thus, more or less of the frequency response is affected as desired. If a −3 dB attenuation is applied to a 3 dB peak, but due to the limitations of the system, applied at a frequency slightly away from this peak, adjacent frequencies may be unnecessarily attenuated, and the desired "peak" not properly flattened.

The second problem can be at least partially offset using a brute force approach. If the equalization software was provided with an enormous number of narrow-band parametric equalization elements, then individual peaks and valleys could be selectively eliminated in the system response. However, such an approach may be processor-, memory-, and hardware-intensive.

The first problem can be resolved by using an equalizer that targets both magnitude and phase, if the system designer is not limited to the use of an existing magnitude-only equalization algorithm already present in a product.

U.S. Pat. No. 6,721,426 to Allred et al. discloses an automatic loudspeaker equalizer. First digital data is provided for a tolerance range for a target response curve of sound level versus frequency for the loudspeaker. Second digital data is generated for an actual response curve of sound level versus frequency for the loudspeaker. The first digital data is compared with the second digital data, and it is determined whether the actual response curve is within the tolerance range. If the actual response curve is not within the tolerance range, digital audio filters are iteratively generated, and the digital audio filters are applied to the second digital data to generate third digital data for a compensated response curve. The frequency, amplitude and bandwidth of the digital audio filters are automatically optimized until the compensated response curve is within the tolerance range or a predetermined limit on the number of digital audio filters has been reached, whichever occurs first.

The iterative approach of Allred improves equalization of the audio system, resulting in a flatter system response. However, the iterative approach can take considerable time to achieve. In particular, in the system of Allred, only one equalization element is adjusted with each iteration. As a result, it will take at least as many iterations as equalization elements to properly adjust all equalization elements and insure each equalization adjustment does not introduce new artifacts into the equalization. For a consumer electronic system (e.g., Home Theater system), this solution may not be acceptable, as the process may continue on for some time. The consumer may get impatient or believe the process if not functioning properly and terminate the process prior to completion.

Thus, it remains a requirement in the art to provide an equalization technique that more accurately equalizes a home theater or other audio system while using a limited number of equalization elements and/or working within the parameters of an existing equalization algorithm. It remains a further requirement in the art to provide an equalization technique that optimizes the use of equalization elements for a given audio environment. It remains a further requirement in the art to provide an equalization technique that can optimize equalization settings without requiring a large number of iterative time-consuming processes.

SUMMARY OF THE INVENTION

Rather than basing the entire equalization setup on only one pass of the analysis phase, multiple passes are executed in the equalization setup and modification of the equalization is performed after each pass of the analysis phase. This modification allows the software to modify its initial settings to compensate for the unexpected effects of the original equalization. The number of passes can vary widely, as can the equalization adjustment or setting at each step.

After an initial pass, the equalization is adjusted, as in the Prior Art, based upon the location of peaks and valleys in the system response. This initial adjustment of equalization may tend to flatten most of the peaks and valleys to produce the desired uniform linear response. However, as noted above, this inexact application of equalization corrections may introduce other artifacts into the system response and/or may not sufficiently normalize equalization.

A second pass is then performed to measure the system response using the new equalization settings. The new peaks and valleys are measured, and the equalization adjusted to try to further flatten response. Any number of subsequent passes may be made to further normalize the equalization. However, in practice, the number of passes may be limited to reduce the amount of time needed for the equalization process.

The optimal number of iterations may be a tradeoff between test time and accuracy. For the most accurate results, one equalizer band per pass may be adjusted, so the number of iterations would be at least the number of equalization bands in the system. However, such a technique may take an excessive amount of time. In the preferred embodiment, two or three (or more) equalization bands are adjusted at the same time with each pass—the number of passes equals the number of total equalization bands in the equalizer divided by the bands set per pass. Thus, for example, with a nine-band equalizer, setting three bands per pass yields three passes.

DETAILED DESCRIPTION OF THE INVENTION

Figure 1:
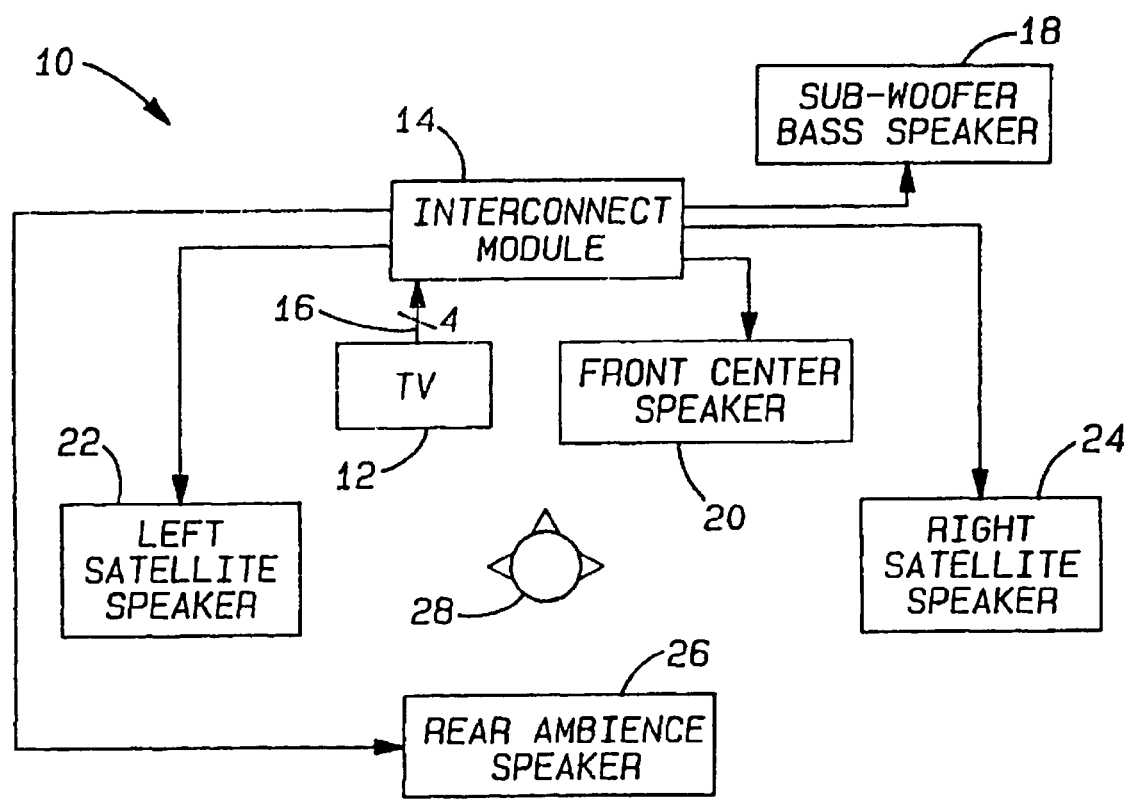
FIG. 1 is a block diagram of the home theater surround sound speaker system in accordance with the Prior Art.
Figure 2:
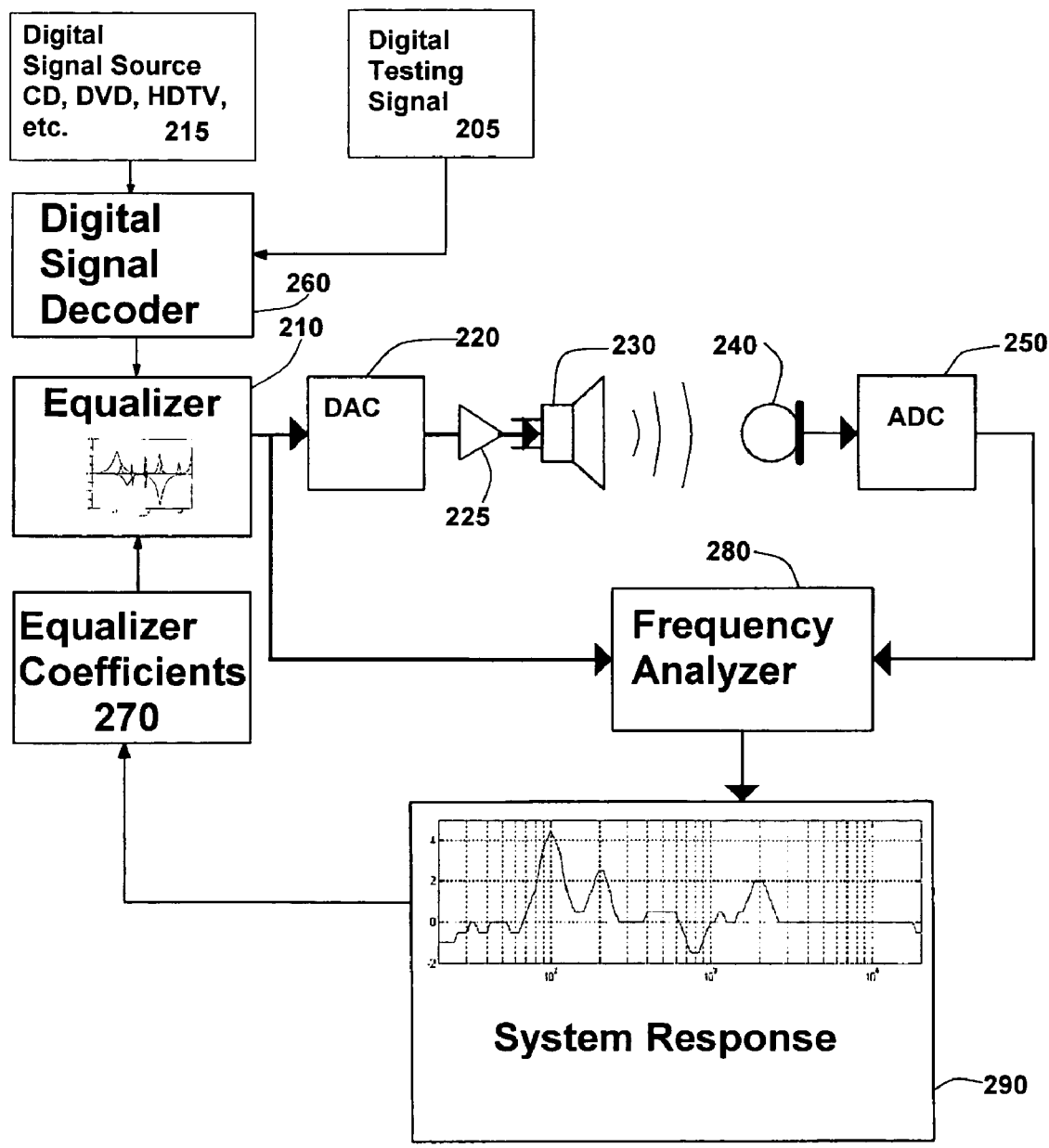
FIG. 2 is a simplified block diagram of the equalization system of the present invention.

FIG. 2 is a simplified block diagram of the equalization system of the present invention. The apparatus of FIG. 2 may be incorporated into a Home Theater system such as that illustrated in FIG. 1, or an other type of audio system, including but not limited to a commercial audio systems, car audio systems, home stereo systems, and the like. For the sake of clarity, various elements that are not essential to the understanding of the invention are not illustrated.

Referring to FIG. 2, a digital signal decoder 260 may receive data from a digital signal source and decode the data accordingly. Examples of such decoders, as noted above, include Dolby™ Digital™ AC-3 decoders, Digital Theater Systems (DTS) decoders, Pulse Code Modulation (PCM) decoders, and the like. Other types of decoders, including proprietary decoding systems, may also be used. Decoder 260 receives digital data from a digital signal source. For ordinary playback of audio, this digital sound source may include digital signal source 215 which may include a CD, DVD, HDTV digital audio track, digital radio, MP-3 data stream, or other digital audio data.

For setup and testing purposes, a digital testing signal 205 may be used to generate a sound pattern for various testing and setup purposes. As set forth in co-pending applications Ser. Nos. 11/002,102 and 11/038,577 cited previously, the test signal may comprise gated nose, a Maximum Length Sequence (MLS) or the like. In some embodiments, almost any source signal may be used for calibration, testing, and setup, including digital signal source 215.

The output of digital signal decoder 260 may be fed to equalizer 210. As previously noted, equalizer 210 may comprise a portion of digital signal decoder 260. Moreover, all or part of both digital signal decoder 260 and equalizer 210 may comprise software or firmware components of the system, as opposed to dedicated hardware components. Thus, equalizer 210 may comprise a run-time equalizer that is executed subsequent to the process of digital signal decoder 260.

Equalizer 210 may be provided with equalizer coefficients 270 to adjust the amplitude of each equalizer element. If equalizer 210 comprises a parametric equalizer, then these coefficients may also include center frequency and frequency ranges for each equalizer element. When initialized, the system may default to predetermined coefficients. These coefficients may be 0 coefficients (e.g., neither amplifying or attenuating any frequency band) or some other predetermined values. To reduce the amount of time for calibration and setup, the default coefficients may be selected to represent proper equalization for a "typical" consumer setting or other area.

The system may enter an equalization setup mode automatically when first powered up, or at the direction of the consumer (e.g., through infrared remote control, on-screen menu, or the like). Once the equalization calibration process begins, the digital testing signal 205 (or other signal) is fed to digital signal decoder 260 and equalizer 210, which outputs a decoded and equalized digital audio signal to digital to analog converter (DAC) 220. DAC 220 may then output an audio signal that may be amplified in amplifier 225 and then be reproduced in the room by speaker 230.

For purposes of illustration, only one speaker 230 is shown in FIG. 2. It will be appreciated by one of ordinary skill in the art that other numbers of speakers may be used, including, but not limited to left and right front speakers, center speakers, left and right rear speakers, surround sound speakers, subwoofers, and the like. Each speaker may be tested separately or in some combination. (Tests are typically done separately, except when testing the combination of a speaker and subwoofer)

Microphone 240 receives the audio signal from the room. As set forth in co-pending applications Ser. Nos. 11/002,102 and 11/038,577 cited previously, microphone 240 might also be used for other testing purposes, such as measuring speaker location and determining time delay. Thus, the same components in the system may be used for more than one purpose in setting up the system.

The output of microphone 240 may be fed to Analog to Digital Converter (ADC) 250 that in turn outputs a digital audio signal to frequency analyzer 280. Frequency analyzer 280 may process the digital audio signal from ADC 250 and/or compare this signal with the source digital audio signal output from equalizer 210. The result of this analysis is output as the system response 290. System response 290 may be kept internal to the system; however, in some embodiments, system response 290 may be displayed on an on-screen display, LCD display or the like so that the consumer can better understand the process and view the results of the setup and calibration procedure.

As will be discussed in more detail in connection with FIGS. 3-5, the system response may be analyzed by the system to determine which frequencies should be attenuated and which accentuated. The results of these decisions are used to alter the equalizer coefficients 270.

After an initial system response 290 has been determined, equalizer coefficients 270 may be adjusted and the process repeated. If individual elements of equalizer 270 are adjusted one at a time, it may take a large number of repeated processes to properly calibrate equalizer 270. Moreover, if the number of processes is limited (due to testing time considerations), the resulting calibration may not be optimal. Thus, for example, if there are seven elements in equalizer 270, and seven processes are repeated, one for each equalizer element, then each element is adjusted only once.

In the present invention, a multiple number of equalizer elements may be adjusted in one process, and thus the overall testing time may be limited, while enhancing the adjustment of the equalizer elements. The optimal number of iterations may be a tradeoff between test time and accuracy. In the preferred embodiment, two or three (or more) equalization bands are adjusted at the same time with each pass—the number of passes equals the number of total equalization bands in the equalizer divided by the bands set per pass. Thus, for example with a nine-band equalizer, setting three bands per pass yields three passes.

In addition, each band can be re-adjusted to compensate for the subsequent adjustment of other adjacent bands. Thus, an equalizer band may be initially adjusted, the results tested, and the band adjustment then fine-tuned to improve the overall system response. Additionally, in the preferred embodiment a proximity range may be applied to the initial peaks to be adjusted, such that adjacent or proximal bands of the equalizer are not adjusted simultaneously, resulting in artifacts in the resultant system response.

Rather than basing the entire EQ setup on only one pass of the analysis phase, multiple analysis phases are executed with EQ setup and modification occurring after each analysis phase. This allows the software to modify its initial settings to compensate for unexpected effects of the original equalization. The number of passes can vary widely, as can the EQ adjustment or setting at each step. For example, one extreme might be:

```
Do (number of bands)
{
    Analyze
    Set one EQ band
    While(unsatisfied)
    {
        Analyze
        Tweak EQ band
    }
}
```

At the other extreme:
Analyze
Set all EQ bands
Analyze
Tweak all EQ bands
Or
Analyze
Set half the EQ bands Analyze Set the other half Additionally, when setting a plurality of bands at one time, it may be beneficial to ensure that those bands are orthogonal so that they do not affect each other. FIG. 3 is a graph illustrating an example of initial system response before equalization correction is applied. The X-axis represents frequency, on a logarithmic scale, while the Y-axis represents relative amplitude in dB. As previously discussed, an ideal system response may comprise a flat line at the 0 dB level, indicating that each frequency in the spectrum is reproduced faithfully and at the same level relative to all other frequencies in the spectrum.

Figure 3:
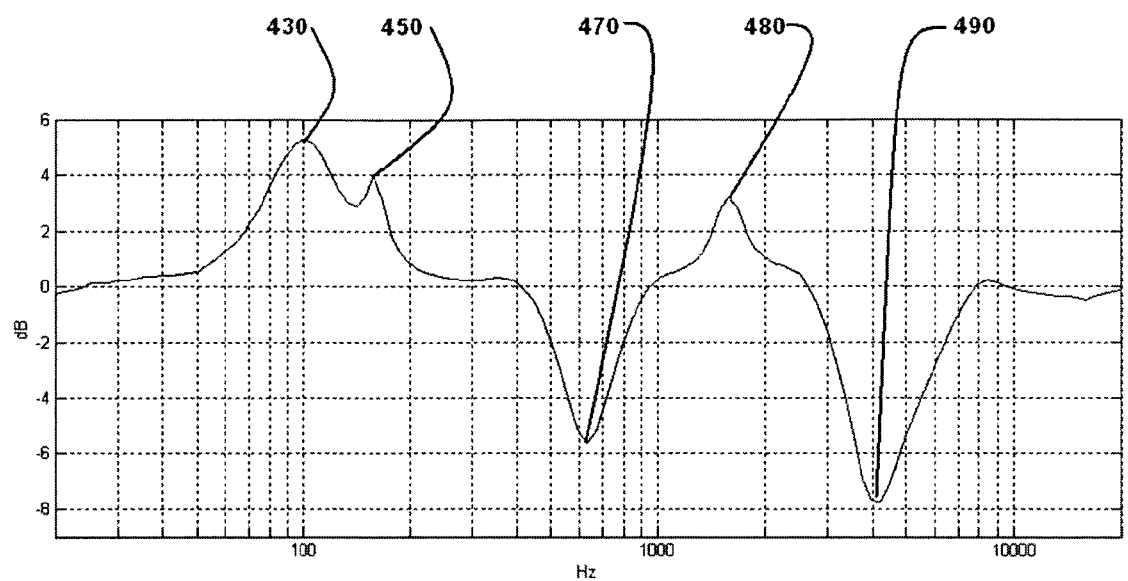
FIG. 3 is a graph illustrating initial system response before equalization correction is applied identifying peaks and valleys in the system response.

As illustrated in the example system response of FIG. 3, the overall response is anything but "flat". Several peaks occur at different frequencies, representing frequencies that are overly amplified. Several valleys are illustrated that represent frequencies that are overly attenuated. In this example, major peaks 430, 450 and 480 are located at approximately 100 Hz, 150 Hz, and 1500 Hz, respectively. Significant valleys 470 and 490 are present at approximately 600 Hz and 4000 Hz, respectively. The rest of the spectrum is relatively flat, or outside the range of human hearing or system (particularly speaker) range.

Figure 4:
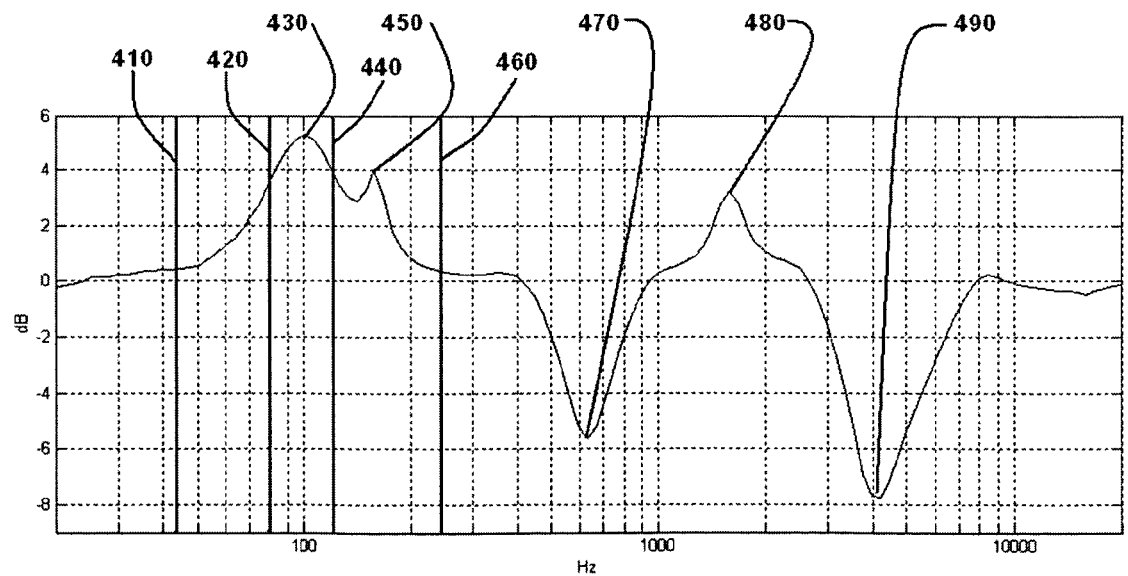
FIG. 4 is a graph illustrating initial system response, identifying peaks for equalization adjustment and illustrating application of a proximity range to determine which peaks and valleys will be equalized in a first pass.

FIG. 4 is a graph illustrating initial system response, identifying peaks for equalization adjustment and illustrating peak width measurement as well as the proximity range applied in the present invention. In this example, when setting two bands between analysis phases, the first can be anywhere in the spectrum, but the second should be limited to anywhere in the spectrum except within a specified distance of the center frequency of the first, in order to prevent interference between the two corrections. Given the spectrum in FIGS. 3 and 4, the first large peak 430 may be targeted at 100 Hz with the first equalizer band, but selection for the second band would ignore the next peak 450 at 150 Hz because of its "close" proximity to the 100 Hz peak 430.

In this embodiment, a predetermined proximity range may be selected, for example, as four times (4×) the bandwidth of the first peak 430. This range is represented in FIG. 4 by solid lines 410 and 460. The bandwidth of the first peak 430 is illustrated by solid lines 420 and 440. Bandwidth of a peak, such as peak 430, may be determined by the width of the peak at a particular predetermined dB cutoff level such as −3 dB from the peak, or by the width at a particular percentage of the peak (in this example 70%, or 4 dB).

As second peak 450 is within the 4× range lines 410 and 460, for the first adjustment of equalizer coefficients 270, peak 450 will be ignored. Instead, the second equalizer band may target one of the smaller valleys 470, 490 or the peak 480. The use of the 4× proximity range prevents the adjustment of adjacent equalizer bands from interfering with each other and producing unexpected or undesirable results. Using this technique, each equalizer element can be adjusted once and still provide a reasonable equalization. Since more than one equalization element is adjusted during each stage, the overall numbers of cycles in the process is reduced.

In this example, a 4× proximity range is utilized. However, other ranges may be used within the spirit and scope of the present invention. For example, the proximity range may be selected as a logarithmic scale based upon peak (or valley) center frequency. Alternately, a fixed proximity range or selected one of a number of fixed proximity ranges may be used. The proximity range can also be determined based upon peak (or valley) amplitude or other indicia. The main feature of the proximity range is to prevent one equalization adjustment from altering or affecting an adjacent equalization adjustment.

In a subsequent cycle, peak 450 may be used to adjust another equalizer band to eliminate this peak. In each subsequent cycle, one or more equalizer elements may be adjusted until all the equalizer bands are optimized for the best system response (e.g., flat response or some other desirable response). In an alternative embodiment, the process may be repeated to fine-tune the equalizer band elements to provide an even better overall system response.

Figure 5:
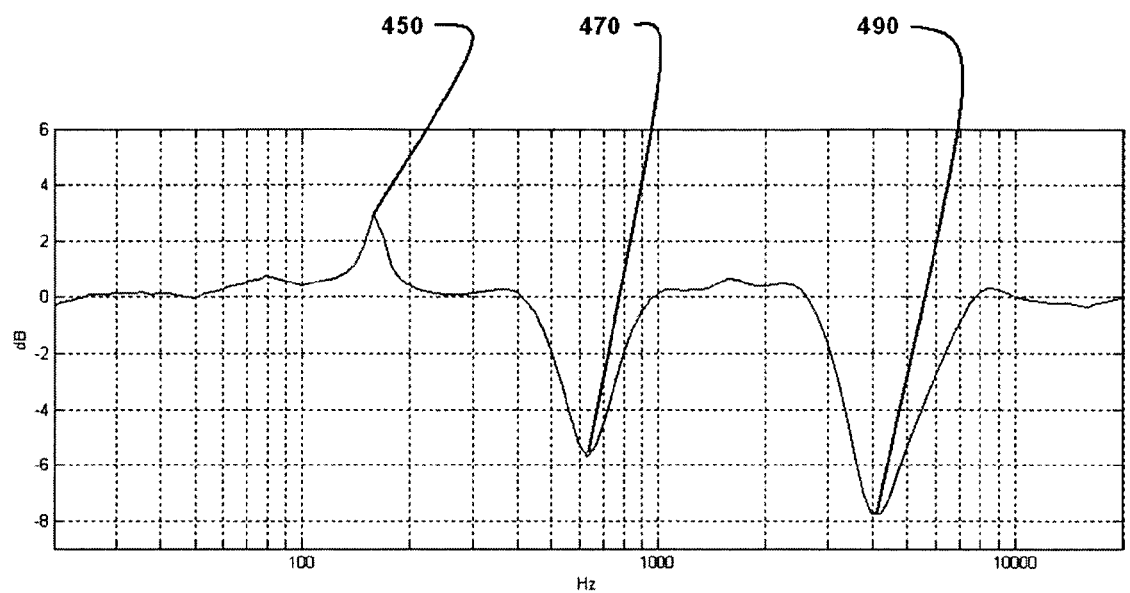
FIG. 5 is a graph illustrating system response after a first pass of equalization adjustment is applied.

FIG. 5 is a graph illustrating system response after equalization is applied. As illustrated in FIG. 5, peaks 430 and 480 have been largely attenuated, such that the overall system response is closer to the desirable flat response (in this example). Peak 450 and valleys 470 and 490 may be corrected in a subsequent cycle, provided they are not within the designated proximity range of one another. In this manner, more than one peak or valley may be corrected per cycle, without the corrections interfering with each other or otherwise creating new artifacts in the system response.

Figure 6:
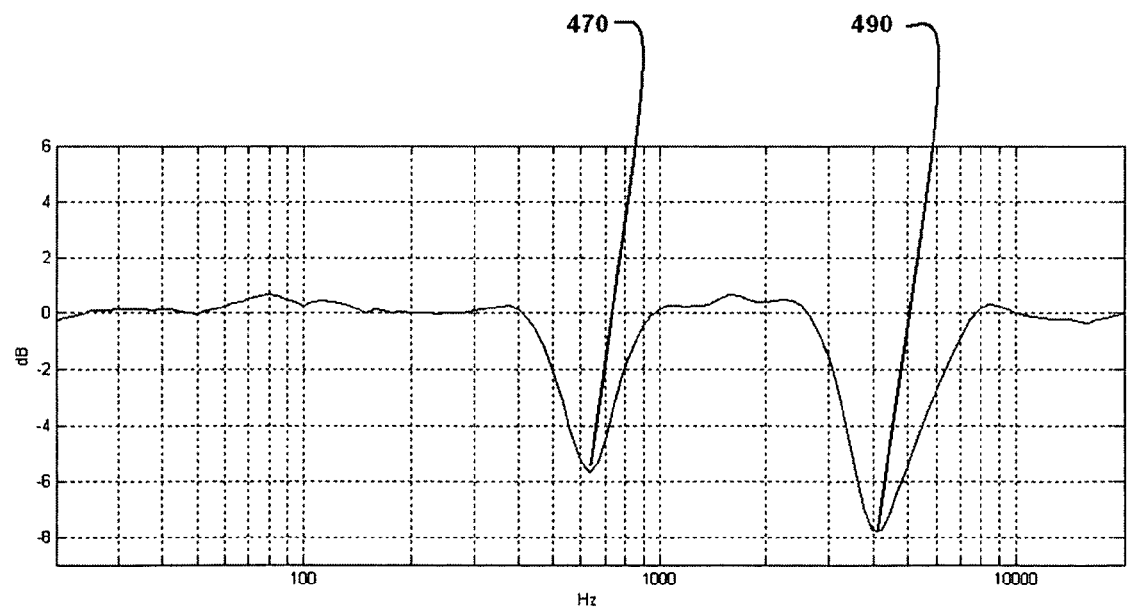
FIG. 6 is a graph illustrating system response after a second pass of equalization adjustment is applied.

FIG. 6 is a graph illustrating system response after a second pass of equalization adjustment is applied. In this example, after peaks 430 and 480 have been attenuated in a first round of adjustment of equalization coefficients, a second round of testing and adjustment may be performed. In this example, only peak 450 is eliminated though adjustment of the equalizer coefficients. Valleys 470 and 490 are left for a subsequent adjustment cycle or cycles.

Figure 7:
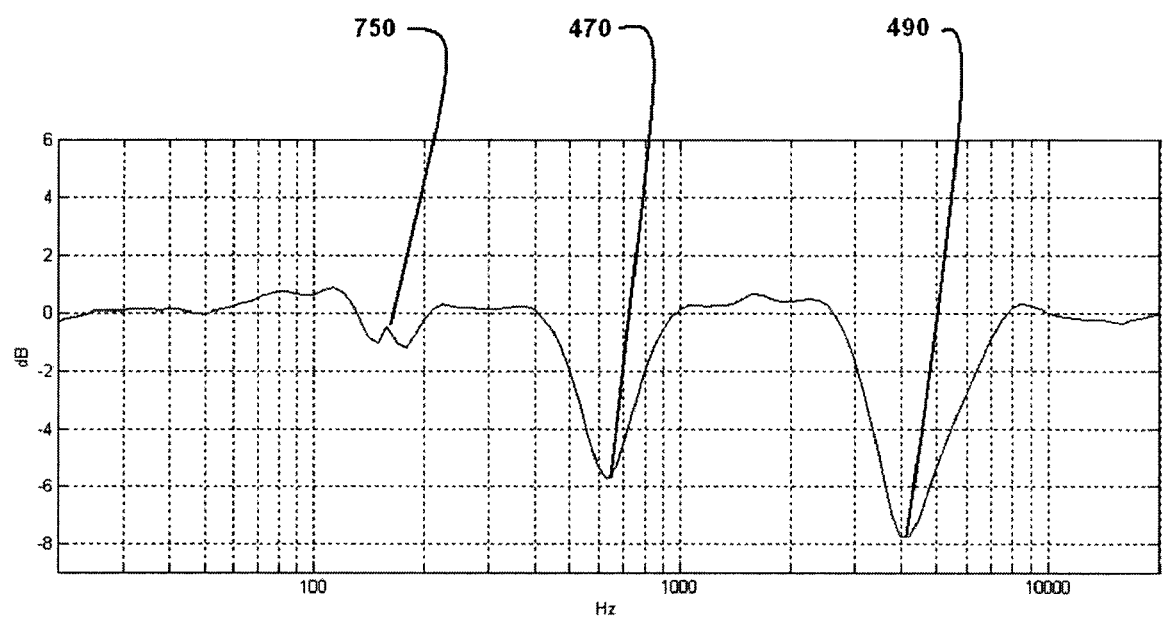
FIG. 7 is a graph illustrating how artifacts can be introduced into the system response if the proximity range is not applied.

FIG. 7 is a graph illustrating how artifacts can be introduced into the system response if the proximity range is not applied. In FIG. 5, the new extent of peak 450 after the first pass of equalization has been applied is illustrated. In FIGS. 3 and 4, this peak is higher. If the proximity range were not applied in the first cycle of adjustment, and the system attempted to adjust equalizer coefficients 270 for the two adjacent peaks 430 and 450, the net effect would be to over-attenuate peak 450, resulting in a new valley 750. Thus, a new valley is created, and the system will have to be "tweaked" further to eliminate this artifact.

While the present invention may be implemented in a number of embodiments, a number of fundamental features are present in one or more of these embodiments. Adjusting multiple equalizer bands during one process cycle is one feature of the present invention. In addition, the use of the proximity range to determine which frequency ranges, which may be adjusted in one cycle without causing adjacent equalizer band interference, is another feature. The use of multiple cycles of the calibration process to fine-tune the equalizer coefficients is yet another feature of the present invention. There are other features of the present invention that may be used alone or in combination with any of the aforementioned features of the present invention.

Note that multiple proximity ranges can be applied in each pass. Thus, in the example of FIG. 4, a second proximity range could be applied to peak 480. This second proximity range, may, for example, indicate that valleys 470 and 490 are not to be compensated in this pass, as they are within 4× the bandwidth (or other criteria) of peak 480. Thus, valleys 470 and 490 would not be corrected until a subsequent pass, as is illustrated in the Example of FIG. 4. The number of proximity ranges used in a given pass can vary and the width or formula used to determine the proximity range size can also be varied as previously noted.

While the preferred embodiment and various alternative embodiments of the invention have been disclosed and described in detail herein, it may be apparent to those skilled in the art that various changes in form and detail may be made therein without departing from the spirit and scope thereof.

I claim:

1. A method for adjusting an equalizer, comprising:
   (a) generating an audio test signal,
   (b) equalizing the audio test signal using an equalizer having a plurality of adjustable equalizer coefficients,
   (c) receiving the audio test signal output from a speaker to a signal detector,
   (d) analyzing the received audio signal to determine system response and detect peaks and valleys in the system response;
   (e) adjusting one or more of the plurality of adjustable equalizer coefficients of the equalizer corresponding to one or more corresponding peaks and valleys in the system response;
   repeating steps (a)-(d) using the equalizer coefficients adjusted in step (e), and
   adjusting remaining equalizer coefficients corresponding to corresponding peaks or valleys in the system response.

2. The method of claim 1, wherein the audio test signal comprises a digital audio test signal, and the equalization is performed in a digital signal decoder, the method further includes:
   converting the digital audio test signal to an analog audio test signal, and
   outputting the audio test signal to a room through a speaker, and
   converting the audio test signal from the signal detector into a digital audio signal.

3. A method of adjusting an equalizer, comprising:
   (a) generating an audio test signal,
   (b) equalizing the audio test signal using an equalizer having a plurality of adjustable equalizer coefficients,
   (c) receiving the audio test signal output from a speaker to a signal detector,
   (d) analyzing the received audio signal to determine system response and detect peaks and valleys in the system response; and
   (e) adjusting one or more of the plurality of adjustable equalizer coefficients of the equalizer corresponding to one or more corresponding peaks and valleys in the system response,
   wherein adjusting one or more of the plurality of adjustable equalizer coefficients of the equalizer corresponding to one or more corresponding peaks and valleys in the system response comprises:
   (f) adjusting an equalizer corresponding to a first peak or valley,
   (g) applying a proximity range to the first peak or valley,
   (h) discarding a subsequent peak or valley within the proximity range, and repeating steps (f) through (h) for a next peak or valley outside the proximity range.

4. The method of claim 3, wherein the audio test signal comprises a digital audio test signal, and the equalization is performed in a digital signal decoder, the method further includes:
   converting the digital audio test signal to an analog audio test signal, and
   outputting the audio test signal to a room through a speaker, and
   converting the audio test signal from the signal detector into a digital audio signal.

5. A method for adjusting an equalizer, comprising:
   (a) generating an audio test signal,
   (b) equalizing the audio test signal using an equalizer having a plurality of adjustable equalizer coefficients,
   (c) receiving the audio test signal output from a speaker to a signal detector,
   (d) analyzing the received audio signal to determine system response and detect peaks and valleys in the system response; and
   (e) adjusting one or more of the plurality of adjustable equalizer coefficients of the equalizer corresponding to one or more corresponding peaks and valleys in the system response,
   repeating steps (a) through (f) to remove artifacts created in the system response due to a previous adjustment of the equalizer coefficients.

6. The method of claim 5, wherein the audio test signal comprises a digital audio test signal, and the equalization is performed in a digital signal decoder, the method further includes:
   converting the digital audio test signal to an analog audio test signal, and
   outputting the audio test signal to a room through a speaker, and
   converting the audio test signal from the signal detector into a digital audio signal.

7. An audio equalizer, comprising:
   an audio test signal generator for generating an audio test signal;
   an equalizer having a plurality of adjustable equalizer coefficients for equalizing the audio test signal;
   an analyzer, coupled to receive the audio test signal as output from a speaker to a signal detector, for analyzing the received audio signal to determine system response and detect peaks and valleys in the system response, and adjusting one or more of the plurality of adjustable equalizer coefficients of the equalizer corresponding to one or more corresponding peaks and valleys in the system response,
   wherein the analyzer analyzes a subsequent test signal equalized by the equalizer using adjusted equalizer coefficients and adjusts remaining equalizer coefficients corresponding to remaining corresponding peaks or valleys in the system response.

8. The audio equalizer of claim 7, wherein the audio test signal comprises a digital audio test signal, and the equalizer comprises a portion of a digital signal decoder,
   wherein the digital audio test signal is converted to an analog audio test signal, and output to a room through a speaker, and the audio test signal from the signal detector is converted into a digital audio signal before being fed to the analyzer.

9. The audio equalizer of claim 8, wherein the audio test signal comprises a digital audio test signal, and the equalizer comprises a portion of a digital signal decoder,
   wherein the digital audio test signal is converted to an analog audio test signal, and output to a room through a speaker, and the audio test signal from the signal detector is converted into a digital audio signal before being fed to the analyzer.

10. An audio equalizer, comprising:
    an audio test signal generator for generating an audio test signal;
    an equalizer having a plurality of adjustable equalizer coefficients for equalizing the audio test signal;
    an analyzer, coupled to receive the audio test signal output from a speaker to a signal detector, for analyzing the received audio signal to determine system response and detect peaks and valleys in the system response, and adjusting one or more of the plurality of adjustable equalizer coefficients of the equalizer corresponding to one or more corresponding peaks and valleys in the system response, wherein the analyzer adjusts an equalizer coefficient corresponding to a first peak or valley, applies a proximity range to the first peak or valley, discards subsequent peaks or valleys within the proximity range, and adjusts an equalizer coefficient for a next peak or valley outside the proximity range.

11. An audio equalizer, comprising:

an audio test signal generator for generating an audio test signal;

an equalizer having a plurality of adjustable equalizer coefficients for equalizing the audio test signal;

an analyzer, coupled to receive the audio test signal as output from a speaker to a signal detector, for analyzing the received audio signal to determine system response and detect peaks and valleys in the system response, and adjusting one or more of the plurality of adjustable equalizer coefficients of the equalizer corresponding to one or more corresponding peaks and valleys in the system response, wherein the analyzer analyzes a subsequent test signal equalized by the equalizer using adjusted equalizer coefficients and adjusts equalizer coefficients to remove artifacts created in the system response due to a previous adjustment of the equalizer coefficients.

12. The audio equalizer of claim 11, wherein the audio test signal comprises a digital audio test signal, and the equalizer comprises a portion of a digital signal decoder, wherein the digital audio test signal is converted to an analog audio test signal, and output to a room through a speaker, and the audio test signal from the signal detector is converted into a digital audio signal before being fed to the analyzer.

13. A home theater system, comprising:

an audio test signal generator for generating an audio test signal;

an equalizer having a plurality of adjustable equalizer coefficients for equalizing the audio test signal;

at least one speaker, placed in a room for generating sound from the audio test signal;

at least one signal detector, placed in the room, for receiving sound from the speaker; and an analyzer, coupled to receive the audio test signal as output from the speaker to the signal detector, for analyzing the received audio signal to determine system response and detect peaks and valleys in the system response, and adjusting one or more of the plurality of adjustable equalizer coefficients of the equalizer corresponding to one or more corresponding peaks and valleys in the system response, wherein the analyzer analyzes a subsequent test signal equalized by the equalizer using adjusted equalizer coefficients and adjusts remaining equalizer coefficients corresponding to remaining corresponding peaks or valleys in the system response.

14. The home theater system of claim 13, wherein the audio test signal comprises a digital audio test signal, and the equalizer comprises a portion of a digital signal decoder, wherein the digital audio test signal is converted to an analog audio test signal, and output to a room through a speaker, and the audio test signal from the signal detector is converted into a digital audio signal before being fed to the analyzer.

15. A home theater, comprising:

an audio test signal generator for generating an audio test signal;

an equalizer having a plurality of adjustable equalizer coefficients for equalizing the audio test signal;

at least one speaker, placed in a room, for generating sound from the audio test signal;

at least one signal detector, placed in the room, for receiving sound from the speaker; and an analyzer, coupled to receive the audio test signal as output from the speaker to the signal detector, for analyzing the received audio signal to determine system response and detect peaks and valleys in the system response, and adjusting one or more of the plurality of adjustable equalizer coefficients of the equalizer corresponding to one or more corresponding peaks and valleys in the system response, wherein the analyzer adjusts an equalizer coefficient corresponding to a first peak or valley, applies a proximity range to the first peak or valley, discards subsequent peaks or valleys within the proximity range, and adjusts an equalizer coefficient for a next peak or valley outside the proximity range.

16. The home theater system of claim 15, wherein the audio test signal comprises a digital audio test signal, and the equalizer comprises a portion of a digital signal decoder, wherein the digital audio test signal is converted to an analog audio test signal, and output to a room through a speaker, and the audio test signal from the signal detector is converted into a digital audio signal before being fed to the analyzer.

17. A home theater system, comprising:

an audio test signal generator for generating an audio test signal;

an equalizer having a plurality of adjustable equalizer coefficients for equalizing the audio test signal;

at least one speaker, placed in a room, for generating sound from the audio test signal;

at least one signal detector, placed in the room, for receiving sound from the speaker; and an analyzer, coupled to receive the audio test signal as output from the speaker to the signal detector, for analyzing the received audio signal to determine system response and detect peaks and valleys in the system response, and adjusting one or more of the plurality of adjustable equalizer coefficients of the equalizer corresponding to one or more corresponding peaks and valleys in the system response, wherein the analyzer analyzes a subsequent test signal equalized by the equalizer using adjusted equalizer coefficients and adjusts equalizer coefficients to remove artifacts created in the system response due to a previous adjustment of the equalizer coefficients.

18. The home theater system of claim 17, wherein the audio test signal comprises a digital audio test signal, and the equalizer comprises a portion of a digital signal decoder, wherein the digital audio test signal is converted to an analog audio test signal, and output to a room through a speaker, and the audio test signal from the signal detector is converted into a digital audio signal before being fed to the analyzer.

* * * * *